United States Patent
Ryu et al.

(10) Patent No.: US 11,723,273 B2
(45) Date of Patent: Aug. 8, 2023

(54) METHOD OF IMPROVING THERMOELECTRIC PERFORMANCE OF SNSE THERMOELECTRIC MATERIAL

(71) Applicants: KOREA INSTITUTE OF SCIENCE AND TECHNOLOGY, Seoul (KR); Pusan National University Industry-University Cooperation Foundation, Busan (KR)

(72) Inventors: Hyejin Ryu, Seoul (KR); Choongyu Hwang, Busan (KR); Kyoo Kim, Daejeon (KR)

(73) Assignees: Korea Institute of Science and Technology, Seoul (KR); Pusan National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 17/551,072

(22) Filed: Dec. 14, 2021

(65) Prior Publication Data

US 2022/0190228 A1 Jun. 16, 2022

(30) Foreign Application Priority Data

Dec. 15, 2020 (KR) ........................ 10-2020-0175532

(51) Int. Cl.
*C30B 9/04* (2006.01)
*C30B 29/52* (2006.01)
*H10N 10/01* (2023.01)
*H10N 10/852* (2023.01)

(52) U.S. Cl.
CPC ................ *H10N 10/01* (2023.02); *C30B 9/04* (2013.01); *C30B 29/52* (2013.01); *H10N 10/852* (2023.02)

(58) Field of Classification Search
CPC ........ C30B 9/04; C30B 29/52; H10N 10/852; C22C 13/00; C22C 28/00
See application file for complete search history.

(56) References Cited

PUBLICATIONS

Min Jin et al., "Super Large Sn1—xSe Single Crystals with Excellent Thermoelectric Performance", ACS Appl. Mater. Interfaces, 11(2019) 8051-8059 (Feb. 5, 2019).
Zhao, Li-Dong et al., "Ultrahigh power factor and thermoelectric performance in hole-doped single-crystal SnSe", Sciencexpress, 10.1126/science.aad3749, Nov. 26, 2015.

*Primary Examiner* — Jessee R Roe
(74) *Attorney, Agent, or Firm* — Rabin & Berdo, P.C.

(57) ABSTRACT

Provided is a method of preparing an SnSe thermoelectric material including (a) heating a mixture including $Sn^{2+}$ and $Se^{2-}$, (b) cooling the mixture at a cooling rate greater than 0 and equal to or less than 3 K/h, and forming single crystal $Sn_{1-x}Se$ (where $0<x<1$), and an SnSe thermoelectric material prepared thereby and including Sn vacancies.

5 Claims, 4 Drawing Sheets

METHOD OF IMPROVING THERMOELECTRIC PERFORMANCE OF SNSE THERMOELECTRIC MATERIAL

CROSS-REFERENCE TO RELATED APPLICATION

This application claims the benefit of Korean Patent Application No. 10-2020-0175532, filed on Dec. 15, 2020, in the Korean Intellectual Property Office, the disclosure of which is incorporated herein in its entirety by reference.

BACKGROUND

1. Field

The present disclosure relates to a method of improving thermoelectric performance of an SnSe thermoelectric material, and more particularly, to a method of improving thermoelectric performance of an SnSe thermoelectric material by introducing Sn vacancies into single crystal SnSe.

2. Description of the Related Art

In general, thermoelectric materials that are materials capable of converting thermal energy into electric energy constitute thermoelectric power generation modules to be used for thermoelectric power generation. Efficiency of a thermoelectric material is determined by thermal conductivity and electrical conductivity. As electrical conductivity increases and thermal conductivity decreases, performance is improved. In a recent report, single crystal SnSe has a maximum ZT value of 2.6 at 923 K. Such excellent thermoelectric properties are caused by very low thermal conductivity expressed by SnSe. Lattice thermal conductivity refers to heat transfer by vibration of lattices. In the case of SnSe, even when one portion is heated and lattices vibrate, the other portion may be maintained in a cool state without vibrating. Heat that does not transferred to the other portion is used to move electrons, and thus SnSe has a high Seebeck coefficient.

Recently, a multivalley band structure of SnSe has been observed by research using angle-resolved photoemission spectroscopy (ARPES). However, correlation between the electronic band structure and thermoelectric performance has not been known in the art.

RELATED ART DOCUMENT

Non-Patent Document (Non-patent Document 1) Zhao, L.-D. Ultrahigh power factor and thermoelectric performance in hole-doped single-crystal SnSe. Science 2016, 351 (6269), 141.

SUMMARY

An object of the present disclosure to solve technical problems is to provide a method of improving thermoelectric performance of an SnSe thermoelectric material by modifying an electronic band structure without performing an additional process in a process of manufacturing single crystal SnSe. However, these problems to be solved are illustrative and the scope of the present disclosure is not limited thereby.

Additional aspects will be set forth in part in the description which follows and, in part, will be apparent from the description, or may be learned by practice of the presented embodiments.

An aspect of the present disclosure provides a method of preparing an SnSe thermoelectric material.

According to an embodiment of the present disclosure, the method of preparing an SnSe thermoelectric material includes (a) heating a mixture including $Sn^{2+}$ and $Se^{2-}$, (b) cooling the mixture at a cooling rate greater than 0 and equal to or less than 3 K/h, and forming single crystal $Sn_{1-x}Se$ (where $0<x<1$).

According to an embodiment of the present disclosure, the single crystal $Sn_{1-x}Se$ may have a power factor (PF) value of 3 to 6 $\mu W/cm \cdot K^2$.

According to an embodiment of the present disclosure, the single crystal $Sn_{1-x}Se$ may have an electrical conductivity of 2 to 20 $S \cdot m^{-1}$.

According to an embodiment of the present disclosure, holes of $Sn_{1-x}Se$ may be doped as the x value increases in step (c).

According to an embodiment of the present disclosure, a valence band maximum energy ($E_{VBM}$) may increase as the cooling rate decreases in step (b).

Another aspect of the present disclosure provides an SnSe thermoelectric material.

According to an embodiment of the present disclosure, the SnSe thermoelectric material may include Sn vacancies and have a chemical formula of $S_{1-x}Se$ (where $0<x<1$) in a single crystal form.

According to an embodiment of the present disclosure, a power factor (PF) value may be from 3 to 6 $\mu W/cm \cdot K^2$.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
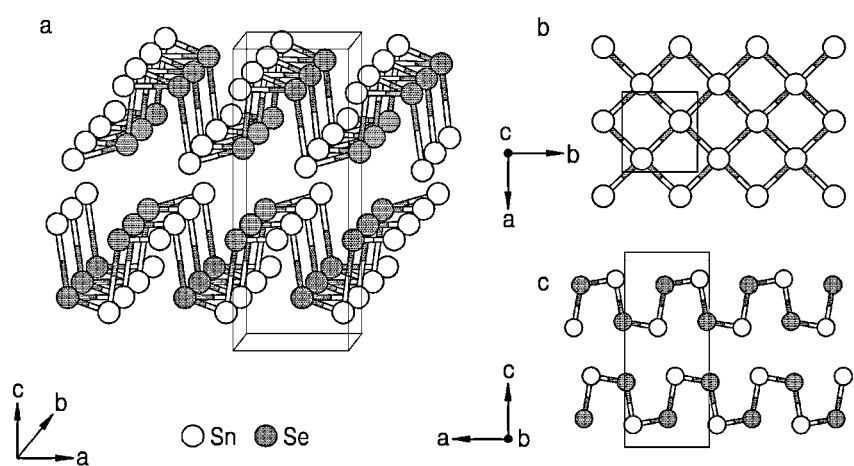
FIG. 1 is a schematic diagram illustrating a crystal structure of tin (II) selenide (SnSe) according to an embodiment of the present disclosure.

In the following detailed description, reference is made to the accompanying drawings that show, by way of illustration, specific embodiments in which the invention may be practiced. The invention may, however, be embodied in many different forms and should not be construed as being limited to the embodiments set forth herein; rather, these embodiments are provided so that this disclosure will be thorough and complete and will fully convey the concept of the invention to those skilled in the art. Throughout the specification, like reference numerals denote like elements. Furthermore, various components and regions are schematically illustrated in the drawings. Therefore, the technical conception of the present invention is not limited by relative sizes and intervals shown in the accompanying drawings.

Hereinafter, embodiments of the present disclosure will be described in detail with reference to the accompanying drawings for one of ordinary skill in the art to be able to perform the disclosure without difficulty.

FIG. 1 is a schematic diagram illustrating a crystal structure of tin(II) selenide (SnSe) according to an embodiment of the present disclosure. Referring to a of FIG. 1, SnSe is a metal chalcogenide including $Se^{2-}$ and $Sn^{2+}$ aligned in a layered structure and has a layered orthorhombic crystal structure at room temperature. B and c of FIG. 1 are a plan view and a side view of SnSe, respectively. SnSe belongs to a space group Pnma satisfying lattice constants a=4.15 Å, b=4.44 Å, and c=11.57 Å. Two layers of SnSe are stacked by week van der Waals interactions along the c-direction.

According to an embodiment of the present disclosure, thermoelectric performance of SnSe depends on the low energy electronic band structure. Among thermoelectric properties that determine thermoelectric performance, dimensionless figure of merit (ZT) is an important indicator to determine a thermoelectric conversion energy efficiency and may be expressed by the following equation.

$$ZT=(S)^2\sigma T/(k_e+k_l)$$

Here, S, $\sigma$, $k_e$, and $k_l$ indicate Seebeck coefficient, electrical conductivity, electron thermal conductivity, and lattice thermal conductivity, respectively. ZT determines efficiency of a thermoelectric material. In this regard, a power factor often used to measure thermoelectric properties is defined as follows.

$$PF=(S)^2\sigma$$

The power factor is a value representing an output of unit length per unit area of a thermoelectric material, and a high ZT value may be obtained from a high power factor. That is, a material having a high Seebeck coefficient, a high electrical conductivity, and a low thermal conductivity may have excellent thermoelectric properties. By manufacturing such a thermoelectric material, cooling efficiency and power generation efficiency may be increased.

In an embodiment of the present disclosure, synthesis of SnSe may be performed by reaction between tin and selenium at a temperature over 350° C. For example, after dissolving tin powder and selenide powder in a solvent, the solution is maintained at a temperature slightly higher than a saturation temperature, and then the temperature is slowly lowered to create SnSe crystals. This synthesis process may be performed in a crucible formed of platinum or alumina.

According to measurement using angle-resolved photoemission spectroscopy (ARPES) and calculation using density functional theory (DFT), a multi-valley valence band maximum (VBM) binding energy of SnSe may be adjusted by Sn vacancies. In addition, the VBM value may vary according to a cooling rate while single crystals of SnSe are growing. ARPES intensity maps on SnSe crystals that have grown with different cooling rates were measured along a Y-Γ-Y direction. As a result, the entire electronic band structure moves to a higher binding energy as the overall cooling rate increases. This indicates that charge carrier density of SnSe is controlled by the cooling rate.

According to an embodiment, the amount of generated nuclei may be increased by adjusting the cooling rate to 3 K/h or less during a process of growing single crystals of SnSe. This may lead to an increase in the concentration of a carrier, thereby contributing to an increase in the PF value.

Figure 4A:
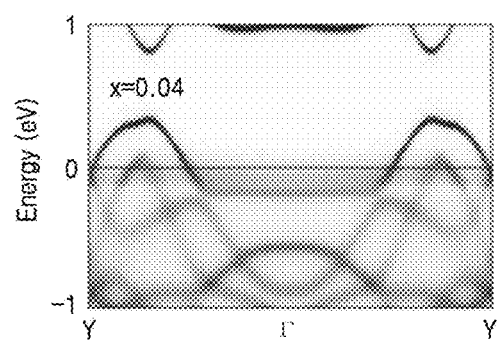
FIG. 4A and FIG. 4B are, respectively, a graph illustrating an electronic band structure of SnSe having Sn vacancies according to an embodiment of the present disclosure calculated using a KKR-CPA method.
Figure 4B:
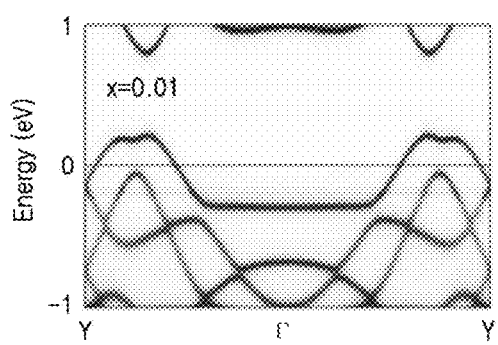

FIG. 4 is a graph illustrating an electronic band structure of SnSe having Sn vacancies according to an embodiment of the present disclosure calculated using a KKR-CPA method. In this regard, x represents Sn vacancies in Sample $Sn_{1-x}$, and x values of (a) and (b) of FIG. 4 are 0.04 and 0.01, respectively. According to the electronic band structure calculated in the Γ-Y-Γ direction, it may be confirmed that the overall band structure moves to a lower binding energy, but the electronic band structure hardly changes as x increases. A non-dispersive purge state observed below the Fermi energy results from scattering of impurities.

Figure 5:
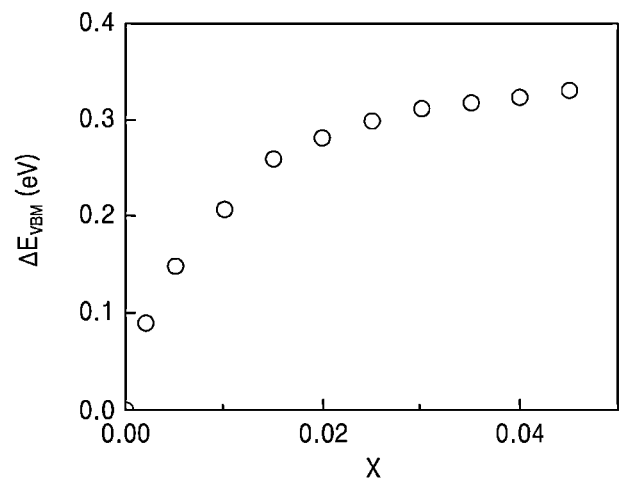
FIG. 5 is a graph illustrating calculated doping dependance of valence band maximum (VBM) energy of SnSe according to an embodiment of the present disclosure.

FIG. 5 is a graph illustrating doping dependance of valence band maximum (VBM) energy of SnSe according to an embodiment of the present disclosure calculated by KKR. A function of $E_{VBM}$ with respect to doping ratio x was observed. As x increases, $\Delta E_{VBM}$ gradually increases leading to Sn vacancies to hole doping of SnSe. As the cooling rate increases to move $E_{VBM}$, Sn vacancies are reduced. As the cooling rate decreases, hole doping of SnSe may increase.

Hereinafter, the present disclosure will be described in more detail with reference to the following examples. However, the following examples are merely presented to exemplify the present disclosure, and the scope of the present disclosure is not limited thereto.

EXAMPLE

Preparation of Single Crystal SnSe Sample

After mixing tin powder (purity of 99.99%, product of Alfa Aesar) with selenium powder (purity of 99.98%, product of Alfa Aesar) in a molar ratio of 1:1, the mixture was heated while slowing increasing temperature from room temperature to 500° C. for 32 hours and then increasing the temperature to 950° C. for 45 hours. The resultant was immersed at 950° C. for 15 hours, cooled to 900° C. for 10 hours, and then cooled to 800° C. In this case, the cooling rate was adjusted to 0.5, 1, 2, 3, 4, and 5 K/h. Finally, the resultant was cooled over 100 hours at room temperature.

EXPERIMENTAL EXAMPLE

Figure 2:
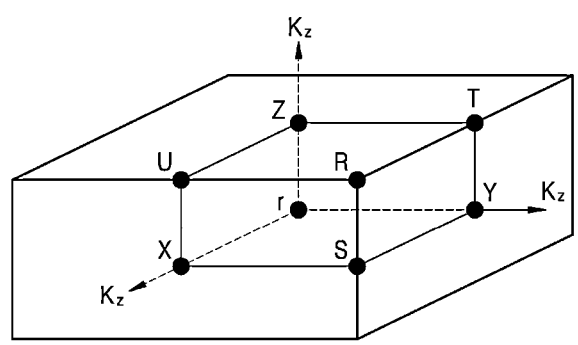
FIG. 2 is a schematic diagram illustrating a unit cell structure of SnSe according to an embodiment of the present disclosure.

FIG. 2 is a schematic diagram illustrating a unit cell structure of single crystals of SnSe prepared in the above-described example showing Brillouin zone of Pnma. Based on ARPES intensity maps obtained in a Y-Γ-Y direction shown in FIG. 2, 4 peaks and 3 valleys are observed in $E_{VBM}$ around site Y.

Figure 3:
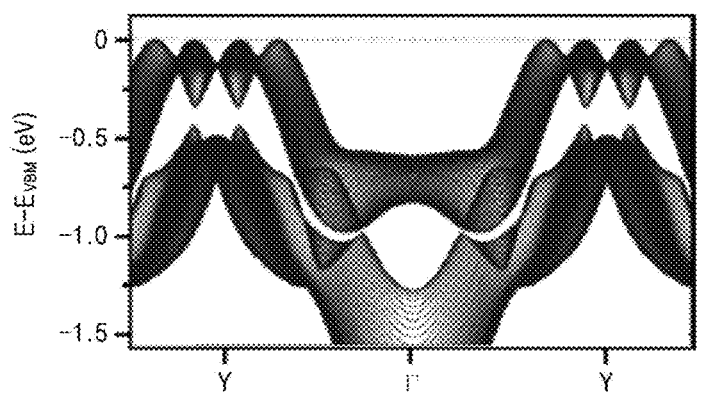
FIG. 3 is a graph illustrating a low energy electronic band structure of SnSe according to an embodiment of the present disclosure.

FIG. 3 illustrates a low energy electronic band structure of SnSe prepared in the above-described example. As a result of calculating the electronic band structure of SnSe using a Perdew-Burke-Ernzerhof functional combined with modified Becke-Johnson potential (PBE+mBJ) method, distinguishable 4 peaks were observed around the site Y. This result is consistent with that of the observed ARPES intensity, indicating that the PBE+mBJ method accurately explains electronic interactions of SnSe.

Figure 6:
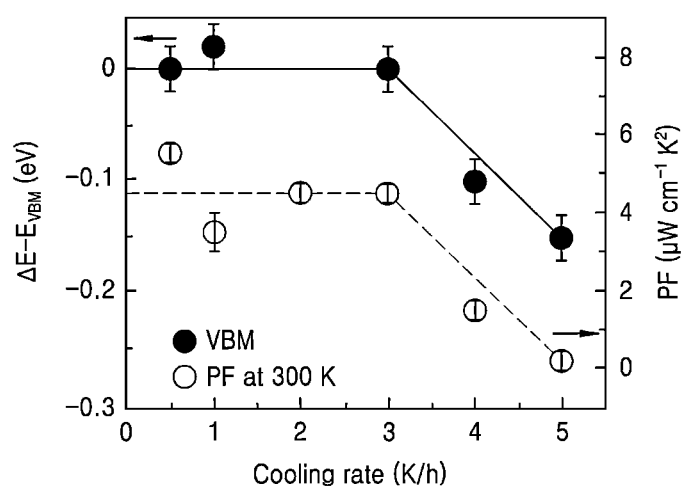
FIG. 6 is a graph illustrating $\Delta E\text{-}E_{VBM}$ and PF values according to a cooling rate of SnSe according to an embodiment.

Thermoelectric performance of an SnSe thermoelectric material selected based on such characteristics as described above may be identified in FIG. 6. FIG. 6 shows dependence of $\Delta E$-$E_{VBM}$ and PF extracted by ARPES data and the like on the cooling rate for growing crystals. In comparison with PF (red empty circle), cooling rate dependence of $E_{VBM}$ (circle filled with black) is shown. No significant change was visually observed in $E_{VBM}$ until the cooling rate reached 3 K/h. In the case where the cooling rate is further increased, $E_{VBM}$ decreased so that SnSe started to be gradually doped with electrons as Sn vacancies decreased. The $\Delta E_{VBM}$ of the single crystal SnSe prepared in this example of the present disclosure showed a tendency consistent with cooling rate dependence of the power factor PF at 300 K. This indicates that a high power factor PF observed in hole-doped SnSe is closely related to Sn vacancies, i.e., charge carrier density (hole concentration) determined by the cooling rate while the single crystals of SnSe are growing.

According to technical conception of the present disclosure, a high-efficiency thermoelectric material having improved thermoelectric performance may be prepared by increasing a carrier concentration by introducing Sn vacancies into single crystal SnSe.

The above effects of the present disclosure are illustrative, and the scope of the present disclosure is not limited by these effects.

According to the embodiments of the present disclosure as described above, flexible nanostructured film connected in three dimensions having various sizes may be formed on surfaces of stents formed of various materials by a bottom-up method using the ionic surfactant and the auxiliary spacer under chemically mild conditions.

What is claimed is:

1. A method of preparing an SnSe thermoelectric material, the method comprising:
   (a) heating a mixture comprising $Sn^{2+}$ and $Se^{2-}$;
   (b) cooling the mixture at a cooling rate greater than 0 and equal to or less than 3 K/h; and
   (c) forming single crystal $Sn_{1-x}Se$ (where 0<x<1).

2. The method of claim 1, wherein the single crystal $Sn_{1-x}Se$ has a power factor (PF) value of 3 to 6 $\mu W/cm \cdot K^2$.

3. The method of claim 1, wherein the single crystal $Sn_{1-x}Se$ has an electrical conductivity of 2 to 20 $S \cdot m^{-1}$.

4. The method of claim 1, wherein holes of $Sn_{1-x}Se$ are doped as the x value increases in step (c).

5. The method of claim 1, wherein a valence band maximum energy ($E_{VBM}$) increases as the cooling rate decreases in step (b).

* * * * *